(12) United States Patent
Yu (10) Patent No.: US 10,031,179 B2
(45) Date of Patent: Jul. 24, 2018

(54) TESTING METHOD (71) Applicant: INGENII TECHNOLOGIES CORPORATION, Hsinchu County (TW)

(72) Inventor: Cheng-Ta Yu, Hsinchu County (TW)

(73) Assignee: INGENII TECHNOLOGIES CORPORATION, Hsinchu County (TW)

( * ) Notice: Subject to any disclaimer, the term of this patent is extended or adjusted under 35 U.S.C. 154(b) by 105 days.

(21) Appl. No.: 14/979,508

(22) Filed: Dec. 27, 2015

(65) Prior Publication Data

US 2016/0187417 A1 Jun. 30, 2016

Related U.S. Application Data

(60) Provisional application No. 62/098,314, filed on Dec. 30, 2014.

(30) Foreign Application Priority Data

Feb. 26, 2015 (TW) .............................. 104106345 A (51) Int. Cl.
*G01R 31/02* (2006.01)
*G01R 31/26* (2014.01)
*G01R 31/28* (2006.01)

(52) U.S. Cl.
CPC ..... *G01R 31/2898* (2013.01); *G01R 31/2893* (2013.01); *G01R 31/2896* (2013.01)

(58) Field of Classification Search
CPC ............ G01R 1/06794; G01R 31/2884; G01R 31/043; G01R 1/067; G01R 31/2851; G01R 1/073

USPC ....... 324/762.02, 754.1, 537, 754.01, 754.03
See application file for complete search history.

(56) References Cited

U.S. PATENT DOCUMENTS

| 4,026,008 | A | * | 5/1977 | Drees | ................. H01L 21/4842 257/E23.021 |
|---|---|---|---|---|---|
| 2003/0122976 | A1 | * | 7/2003 | Choi | ..................... G02F 1/1309 349/40 |
| 2005/0003583 | A1 | * | 1/2005 | Keating | ................ H01L 21/561 438/111 |
| 2006/0001792 | A1 | * | 1/2006 | Choi | ................... G02F 1/13458 349/54 |
| 2007/0030020 | A1 | | 2/2007 | Kinsley | |

(Continued)

OTHER PUBLICATIONS

"Office Action of Taiwan Counterpart Application", dated Dec. 23, 2015, p. 1-p. 5.

*Primary Examiner* — Giovanni Astacio-Oquendo
(74) *Attorney, Agent, or Firm* — JCIPRNET (57) ABSTRACT

A testing method including the following steps is provided. A lead frame is provided, wherein the lead frame includes a frame body and a plurality of lead frame units which are connected with each other through the frame body and are arranged in array. Each of the lead frame units includes at least one first pin connected with the frame body and a plurality of second pins which are connected with each other. A plurality of controllers are bonded with the lead frame units and each of the controllers is electrically connected with the corresponding lead frame unit. The frame body of each of the lead frame units is electrically isolated from the second pins. A first electrical testing is performed to each of the lead frame units carrying the controllers.

7 Claims, 7 Drawing Sheets

(56) References Cited

U.S. PATENT DOCUMENTS

| | | | |
|---|---|---|---|
| 2007/0046336 A1* | 3/2007 | Kang | G02F 1/1345 326/101 |
| 2009/0028574 A1 | 1/2009 | Dybsetter et al. | |
| 2010/0142272 A1 | 6/2010 | Nguyen et al. | |
| 2013/0020660 A1 | 1/2013 | Milano et al. | |
| 2013/0154679 A1* | 6/2013 | Chen | G09G 3/006 324/754.1 |
| 2014/0375350 A1 | 12/2014 | Tellkamp | |
| 2015/0145524 A1* | 5/2015 | Duncan | G01R 31/024 324/538 |
| 2016/0054370 A1* | 2/2016 | Fomin | G01R 31/025 324/509 |
| 2016/0178689 A1* | 6/2016 | Okita | G01R 31/024 324/509 |

\* cited by examiner

TESTING METHOD

CROSS-REFERENCE TO RELATED APPLICATION

This application claims the priority benefits of U.S. provisional application Ser. No. 62/098,314, filed on Dec. 30, 2014 and Taiwan application serial no. 104106345, filed on Feb. 26, 2015. The entirety of each of the above-mentioned patent applications is hereby incorporated by reference herein and made a part of this specification.

BACKGROUND OF THE INVENTION

1. Field of the Invention

The invention relates to a testing method, and particularly relates to a testing method for electrically testing a lead frame.

2. Description of Related Art

In the semiconductor industry, the production of integrated circuits (ICs) can be mainly divided into three stages, which are IC design, IC process and IC package. In the IC process, a die is manufactured through the processes including manufacturing a wafer, forming an IC, electrical testing, and wafer sawing, etc.

Generally speaking, an electrical testing process is required in various stages in semiconductor manufacturing processes to ensure each die has a normal electrical function, so as to form a suitable integrated circuit together with a lead frame in subsequent wafer-separating and packaging processes.

However, when an IC is designed, the lead frame for carrying the die may also have different electrical properties. Under such circumstance, if the die that is arbitrarily chosen is bonded to the lead frame, the yield rate of the subsequent processes may be affected.

SUMMARY OF THE INVENTION

The invention provides a testing method capable of grading lead frames based on electrical properties of the lead frames.

A testing method according to an embodiment of the invention includes steps as follows. A lead frame is provided. The lead frame includes a frame body and a plurality of lead frame units connected with each other through the frame body and arranged in an array. Each of the lead frame units includes at least one first pin connected with the frame body and a plurality of second pins connected with each other. A plurality of controllers are bonded to the lead frame units, and each of the controllers is electrically connected with one of the lead frame units correspondingly. A plurality of first packages corresponding to the lead frame units are formed on the lead frame. The first packages encapsulate the controllers and the lead frame units, and each of the first packages has an opening to exposes a portion region of the corresponding lead frame unit. The frame body is electrically isolated from the second pins. A first electrical testing is performed to the lead frame units carrying the controllers.

According to an embodiment of the invention, the testing method further includes grading the lead frame units carrying the controllers based on results of the first electrical testing.

According to an embodiment of the invention, the step of electrically isolating the frame body and the second pins includes cutting the second pins of the respective lead frame units, such that the second pins connected with each other are isolated.

According to an embodiment of the invention, the testing method further includes steps as follows. The chips are bonded to the lead frame units exposed by the openings. Each of the chips is electrically connected with one of the lead frame units correspondingly. A second electrical testing is performed to the lead frame units carrying the controllers and the chips.

According to an embodiment of the invention, the testing method further includes grading each of the lead frame units carrying the controllers and the chips based on results of the second electrical testing.

According to an embodiment of the invention, the testing method further includes steps as follows. The chips are bonded to the lead frame units exposed by the opening. Each of the chips is electrically connected with one of the lead frame units correspondingly. A second package is formed in each of the openings to encapsulate the chip. A second electrical testing is performed to the lead frame units carrying the controllers and the chips.

According to an embodiment of the invention, the testing method further includes grading each of the lead frame units carrying the controllers and the chips based on results of the second electrical testing.

Based on above, the testing method according to the embodiments of the invention may perform electrical testing to each of the lead frame units carrying the controllers. Also, based on the results of the electrical testing, the lead frame units carrying the controllers are graded. Thus, the electrical property of each of the lead frame units carrying the controllers in the lead frame may be properly evaluated and selected, so that the lead frame units may be used with the suitable chips based on practical needs to thereby improve the yield rate of the subsequent processes.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
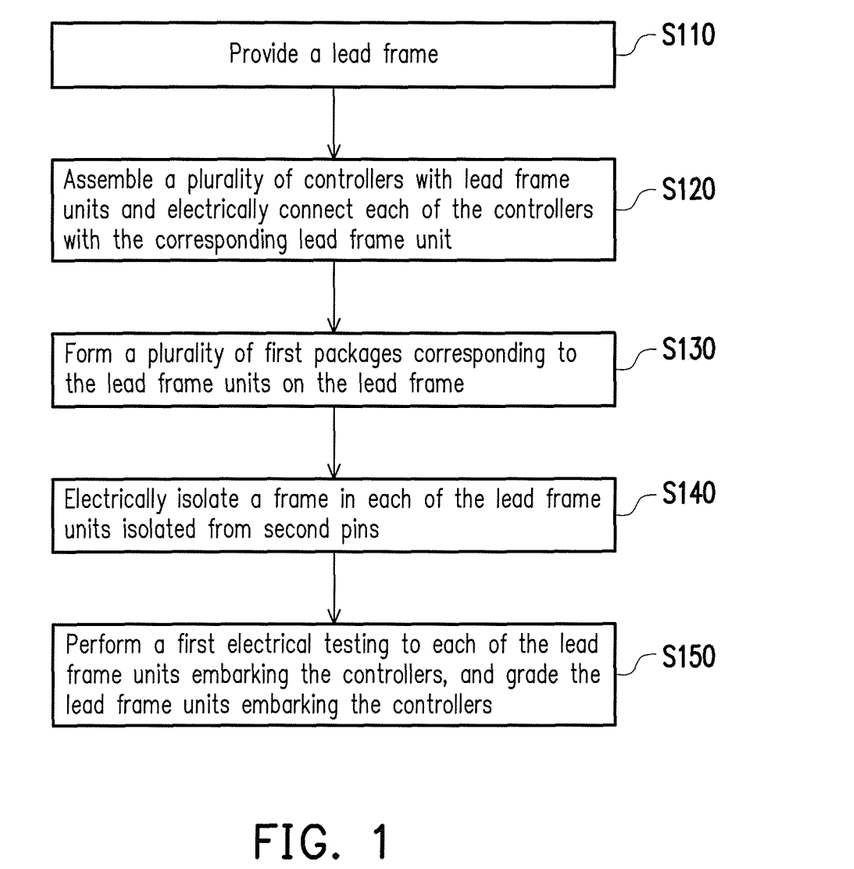
FIG. 1 is a flowchart illustrating a testing method according to an embodiment of the invention.
Figure 2A:
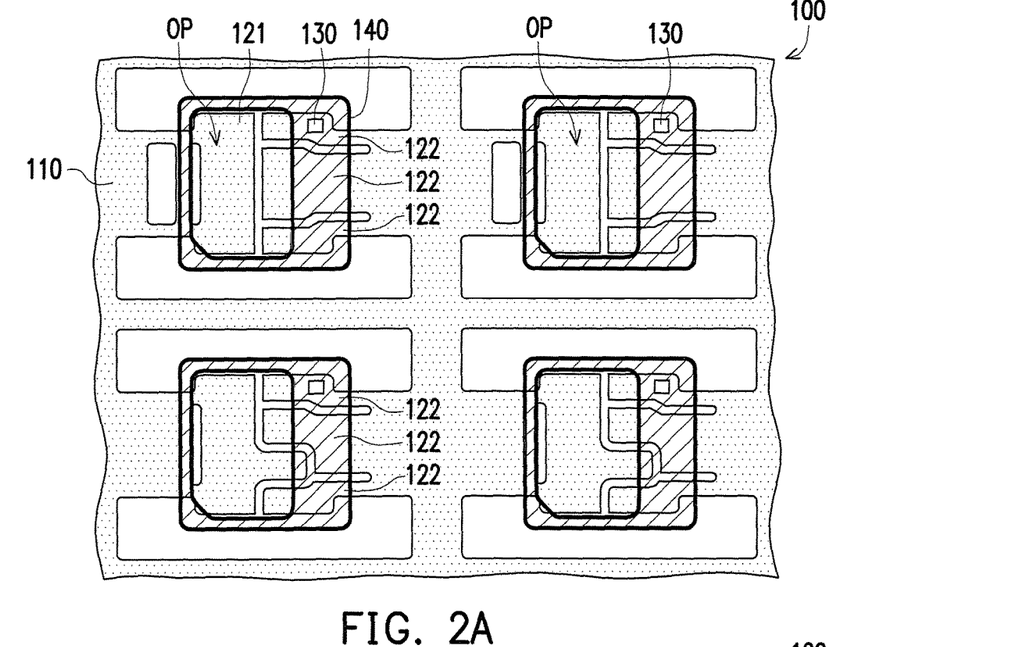
FIGS. 2A to 2B are schematic views illustrating a manufacturing process of a lead frame carrying a controller.
Figure 2B:
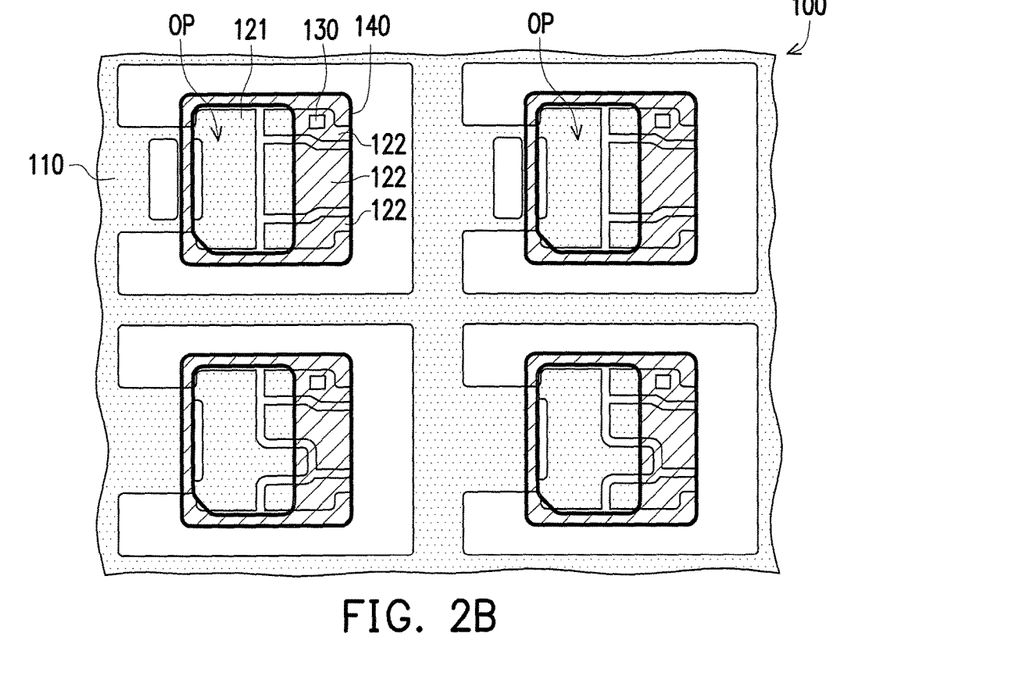
Figure 3:
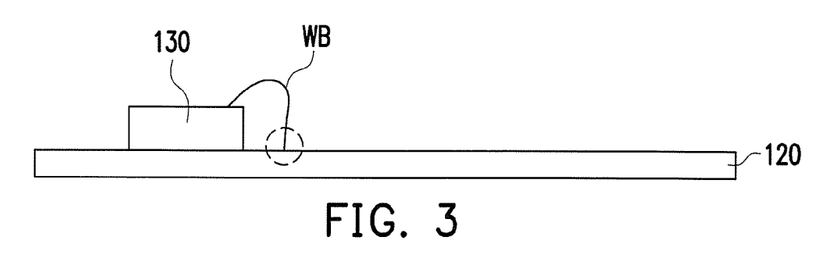
FIG. 3 is a schematic side view illustrating a lead frame unit carrying a controller.

FIG. 1 is a flowchart illustrating a testing method according to an embodiment of the invention. FIGS. 2A to 2B are schematic views illustrating a manufacturing process of a lead frame carrying a controller. FIG. 3 is a schematic side view illustrating a lead frame unit carrying a controller. Referring to FIGS. 1 and 2A, first of all, Step S110 is performed to provide a lead frame 100. Specifically, in this embodiment, the lead frame 100 includes a frame body 110 and a plurality of lead frame units 120 connected through the frame body 110 and arranged in an array, as shown in FIG. 2A. Each of the lead frame units 120 includes at least one first pin 121 connected with the frame body 110 and a plurality of second pins 122. In addition, the second pins 122 are connected with each other.

Then, as shown in FIGS. 1 and 2A, Step S120 is performed to assemble a plurality of controllers 130 to the lead frame units 120 and make the controllers 130 respectively electrically connected with the corresponding lead frame units 120. In this embodiment, as shown in FIG. 3, a plurality of bonding wires WB may be formed by performing a wiring process, for example. In addition, the controller 130 may be electrically connected with at least a part of the second pins 122 through the bonding wires WB. To be more specific, a process of forming the bonding wire WB includes firstly soldering one end of the bonding wire WB to the lead frame 100, dragging a wiring material above the controller 130 by using a wiring machine, and then soldering the other end of the bonding wire WB to the controller 130. Since a height of the bonding wire WB formed in such process is only slightly greater than a thickness of the controller 130, the first package 140 formed subsequently may be thinner.

Then, Step S130 is performed to form a plurality of first packages 140 corresponding to the lead frame units 120 on the lead frame 100. As shown in FIG. 2A, the first packages 140 encapsulate the controllers 130 and the lead frame units 120. Each of the first packages 140 has an opening OP to expose a portion region of the corresponding lead frame unit 120. Moreover, in this embodiment, the first package 140 encapsulates a portion region of each of the second pins 122.

Then, referring to FIGS. 1 and 2B, Step S140 is performed to electrically isolate the frame body 110 and the second pins 122. For example, in this embodiment, the second pins 122 connected to each other may be isolated by cutting (e.g., mechanical cutting or laser cutting). At this time, since the second pins 122 of the lead frame unit 120 are isolated from each other, and the second pins 122 are not connected to the frame body 110, as shown in FIG. 2, relative positions between the second pins 122 and the frame body 110 are only maintained by using the first package 140. In other words, the second pins 122 are in a floating state in the first package 140 and are not connected with the frame body 110. Since the second pins 122 are electrically isolated from each other, a first electrical testing may be respectively performed to the lead frame units 120 carrying the controllers 130 (as shown in Step S150), so as to grade the lead frame units 120 carrying the controllers 130.

For example, in this embodiment, a suitable voltage and/or current may be applied to each of the lead frame units 120 carrying the controllers 130, and results of the first electrical testing may be recorded. Then, in this embodiment, the lead frame units 120 carrying the controllers 130 may be graded based on the results of the first electrical testing. In this way, an electrical property of each of the lead frame units 120 of the lead frame 100 may be properly evaluated and selected, so that the lead frame units 120 may be used with suitable chips 150 based on practical needs to thereby improve a yield rate in subsequent processes.

In the following, further details concerning how the chip 150 is assembled to the lead frame unit 120 are described with reference to FIGS. 4 and 5A to 5C.

Figure 4:
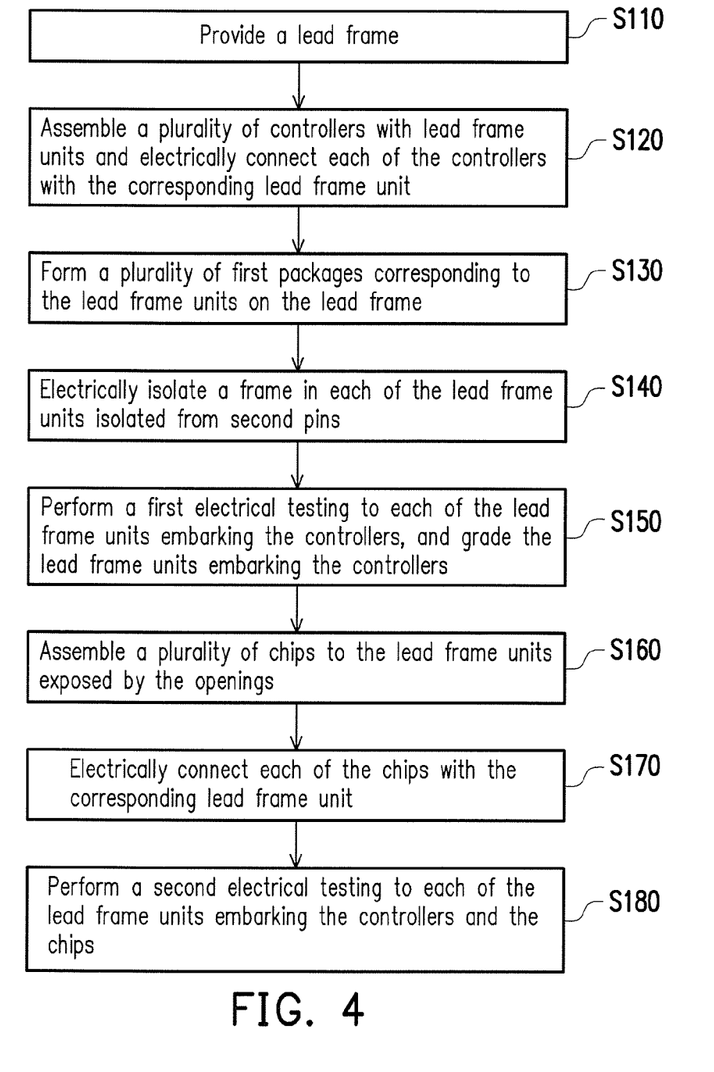
FIG. 4 is a partial flowchart illustrating a testing method according to an embodiment of the invention.
Figure 5A:
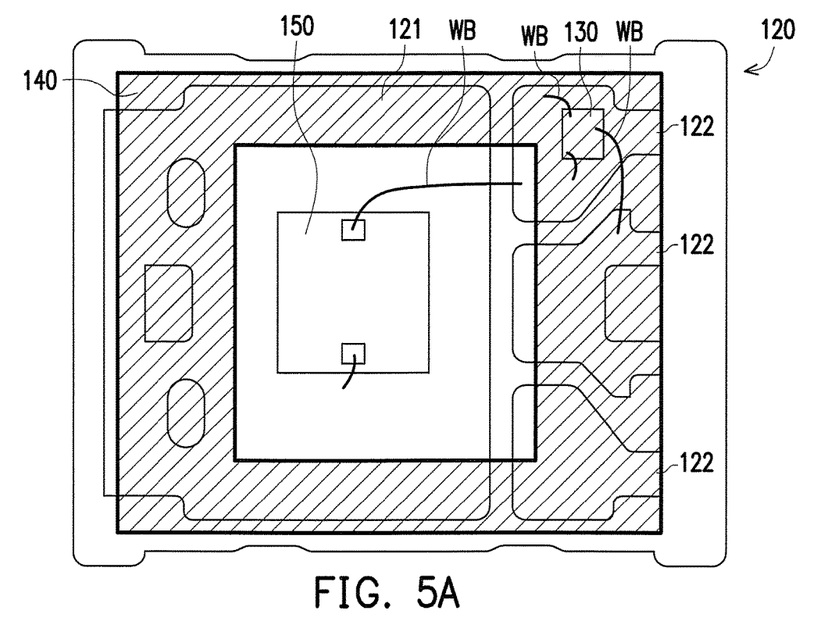
FIGS. 5A to 5C are schematic cross-sectional views illustrating different lead frame units carrying controllers and chips.
Figure 5B:
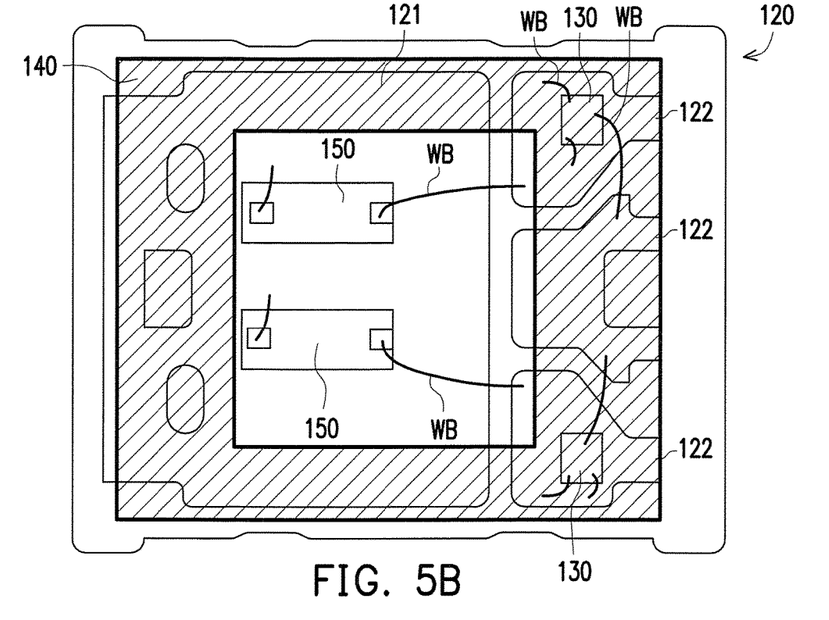
Figure 5C:
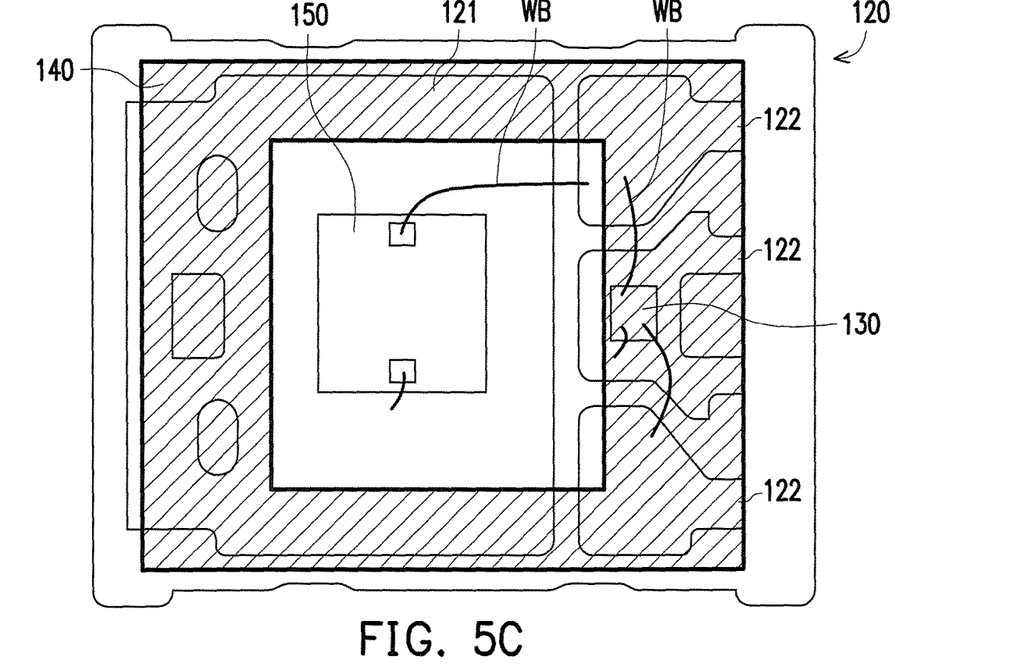

FIG. 4 is a flowchart illustrating a testing method according to another embodiment of the invention. FIGS. 5A to 5C are schematic cross-sectional views illustrating different lead frame units carrying controllers and chips according to an embodiment of the invention. Referring to FIG. 4, the testing method of this embodiment is similar to the testing method of FIG. 1, and the difference between the methods is described in the following. Referring to FIG. 4, processes for performing Steps S110 to S150 shown in FIG. 4 are the same as those described in the testing method of FIG. 1. Thus, details in these respects will not be repeated in the following. Subsequently, after grading the lead frame units 120 carrying the controllers 130, Step S160 is performed to bond the chips 150 to the lead frame units 120 exposed by the openings OP. At this time, the chip 150 may be electrically connected to the controller 130 through the lead frame unit 120. For example, in this embodiment, the chip 150 may be a light emitting diode (LED) chip, a photo-diode chip, or other chips that the controller 130 is capable of controlling and driving. However, the invention is not limited thereto.

In addition, Step S170 is performed to electrically connect each of the chips 150 and the corresponding lead frame unit 120. Specifically, as shown in FIG. 5A, the controller 130 may be electrically connected with the second pins 122 through the bonding wires WB, and the chip 150 may also be electrically connected with the first pin 121 and the second pins 122 through the bonding wires WB. In the embodiment shown in FIG. 5C, the controller 130 is electrically connected with the second pins 122 through the bonding wires WB, and the chip 150 is electrically connected with the first pin 122 and the second pins 122 through the bonding wires WB. For example, in the embodiments shown in FIGS. 5A and 5C, the controller 130 is suitable to be applied with a DC voltage, and a voltage that the controller 130 is capable of carrying is about 15 volts. It should be noted that the numerical value recited herein merely serves as an exemplary purpose and shall not be construed as a limitation of the invention.

In addition, in the embodiments shown in FIGS. 5A and 5C, the number of the chip 150 carried by each of the lead frame units 120 is described as one. However, the invention is not limited thereto. In the embodiment of FIG. 5B, the number of the chip 150 carried by each of the lead frame units 120 is plural, and the number of the controller 130 is also plural (two in FIG. 5B as an example). In addition, the controllers 130 may be electrically connected with the second pins 122 through the bonding wires WB, and the chips 150 are electrically connected with the first pin 121 and the second pins 122 through the bonding wires WB. Also, in this embodiment, a second package (not shown) may also be optionally formed in each of the openings OP to encapsulate the chip 150. In addition, as shown in FIGS. 5A to 5C, the first pin 121 and the second pins 122 are already cut (through mechanical cutting or laser cutting, for example), and not connected with the frame body 110. Since the first pin 121 and the second pins 122 are electrically isolated from each other, an electrical testing may be performed to each of the lead frame units 120 carrying the controllers 130 and the chips 150, so as to grade the lead frame units 120.

More specifically, referring to FIG. 4 again, Step S180 is carried out to perform a second electrical testing to each of the lead frame units 120 carrying the controllers 130 and the chips 150. For example, in this embodiment, a suitable voltage and/or current may be applied to each of the lead frame units 120 carrying the controllers 130, and results of the second electrical testing for the lead frame units 120 are recorded. Also, based on the results of the second electrical testing, the lead frame units 120 carrying the controllers 130 and the chips 150 are graded.

Furthermore, in this embodiment, an external resistance may be optionally connected by choosing different types of the controllers 130, and different circuit designs may be employed, so as to adjust an intensity of an output current to thereby adjust a light output of the chip 150. For example, in the embodiment shown in FIGS. 5A and 5B, the controller 130 may output a constant current when being applied with a constant voltage. As for the embodiment in FIG. 5C, a suitable voltage and/or current may be applied to the controller 130 to adjust the intensity of the output current by using the second pins 122 connected with the external resistance. Accordingly, the electrical property of each of the lead frame units 120 carrying the controllers 130 and the chips 150 may be properly evaluated and selected, so as to be properly used based on practical requirements.

Also, it should be noted that, in the embodiments, even though the controller 130 is described as being electrically connected with at least a part of the second pins 122 through the bonding wires WB, the invention is not limited thereto. In another embodiment not shown herein, the controller 130 may also be electrically connected with at least a part of the second pins 122 and the chip 150 through a plurality of bumps, so as to a flip-chip light emitting diode package structure. For example, the bumps may be disposed on the controller 130 and the second pins 122, and the chip 150 may be connected with the bumps by soldering, thereby electrically connecting the chip 150, the controller 130, and the second pins 122.

Figure 6:
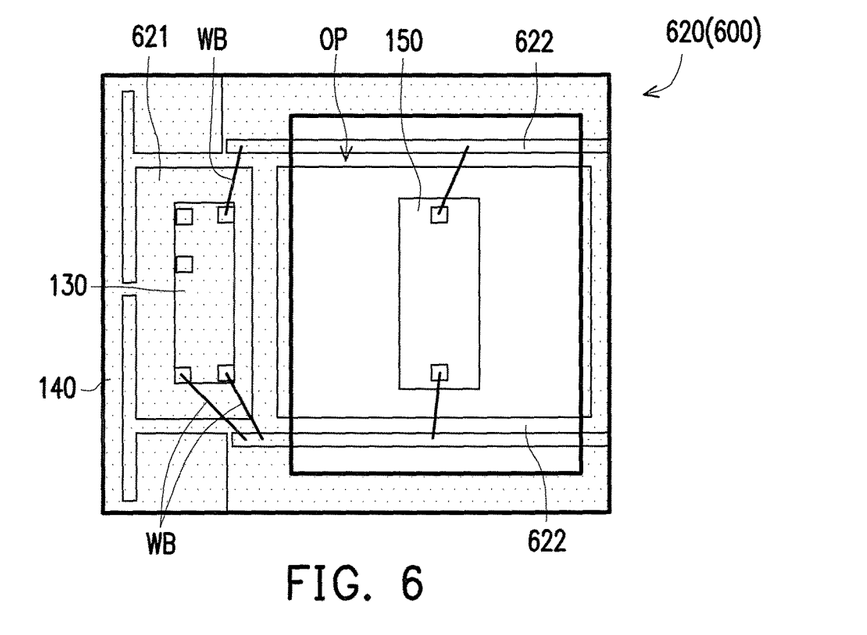
FIG. 6 is a schematic top view illustrating another lead frame according to an embodiment of the invention.

FIG. 6 is a schematic top view illustrating another lead frame according to an embodiment of the invention. Referring to FIGS. 1, 4, and 6, a lead frame 600 formed in this embodiment is similar to the lead frame 100 formed in FIGS. 5A to 5C. Thus, the testing methods shown in FIGS. 1 and 4 are applicable. The difference between the lead frame 600 and the lead frame 100 is described in the following.

Specifically, referring to FIGS. 1 and 6, first of all, Step S110 is performed to provide the lead frame 600. Then, Step S620 is performed to bond the controllers 130 to lead frame units 620 and make each of the controllers 130 respectively connected with the corresponding lead frame unit 620. Moreover, Step S130 is performed to form the first packages 140 corresponding to the lead frame units 620 on the lead frame 600.

More specifically, as shown in FIG. 6, since second pins 622 of the lead frame unit 620 in this embodiment are also electrically isolated from each other, Step S150 shown in FIG. 1 may be carried out to perform the first electrical testing to each of the lead frame units 620 carrying the controllers 130, so as to grade the lead frame units 620 carrying the controllers 130.

For example, in this embodiment, a suitable voltage and/or current may be applied to each of the lead frame units 620 carrying the controllers 130, and results of the first electrical testing may be recorded. Also, based on the results of the first electrical testing, the lead frame units 620 carrying the controllers 130 are graded. In this way, an electrical property of each of the lead frame units 620 of the lead frame 600 may be properly evaluated and selected, so that the lead frame units 620 may be used with suitable chips 150 based on practical needs to thereby improve a yield rate in subsequent processes.

Then, as shown in FIGS. 4 and 6, Step S160 is carried out to bond the chips 150 and the lead frame units 620 exposed by the openings OP, and Step S170 is carried out to make each of the chips 150 respectively electrically connected with the corresponding lead frame unit 620.

More specifically, as shown in FIG. 6, the second pins 622 of the lead frame 600 in this embodiment extend from inside of the first package 140 to outside of the first package 140, so as to be exposed by the opening OP. Accordingly, the lead frame 600 may be used with different circuit designs, so as to be adjustable to different types of the controllers 130. In the following, further details will be provided with reference to FIGS. 7A to 7D.

Figure 7A:
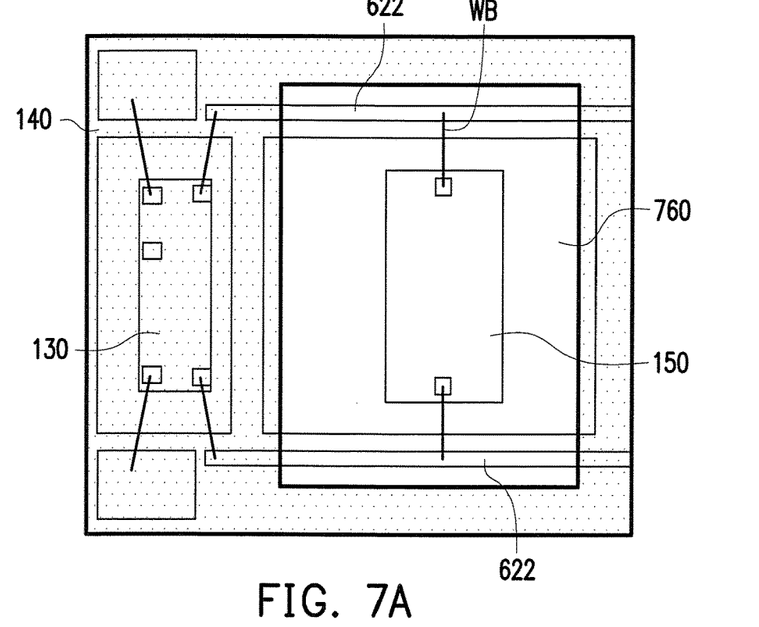
FIGS. 7A to 7D are schematic views illustrating different lead frame units carrying controllers and chips.
Figure 7B:
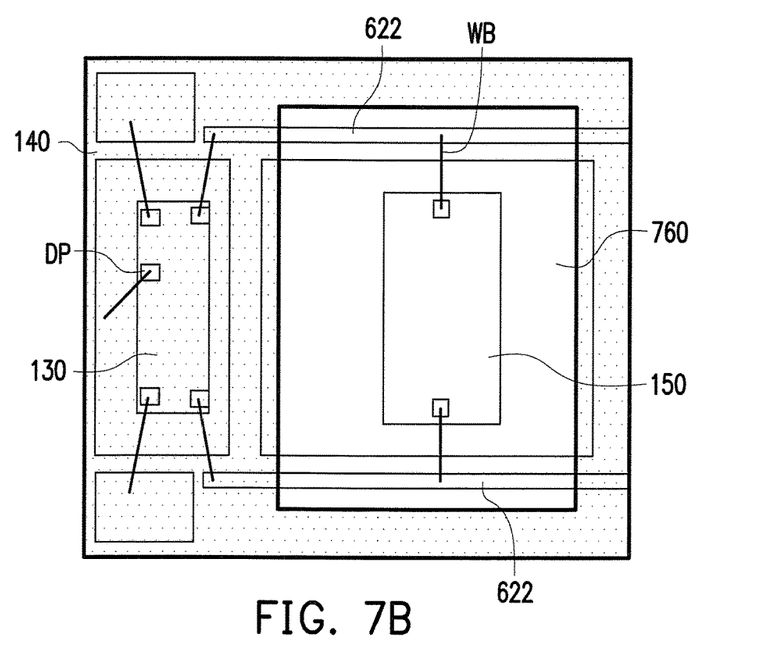

FIGS. 7A to 7D are schematic views illustrating different lead frame units carrying controllers and chips. Specifically, as shown in FIGS. 7A and 7B, the controller 130 may be connected with the second pins 622 through the bonding wires WB, and the chip 150 may also be electrically connected with the second pins 622 through the bonding wires WB. For example, in the embodiment shown in FIGS. 7A and 7B, the controller 130 is suitable to be applied with a DC voltage, and a range of the voltage that the controller 130 is capable of carrying is wider (e.g., greater than 40 volts). It should be noted that the numerical value recited herein merely serves as an exemplary purpose and shall not be construed as a limitation of the invention.

Figure 7C:
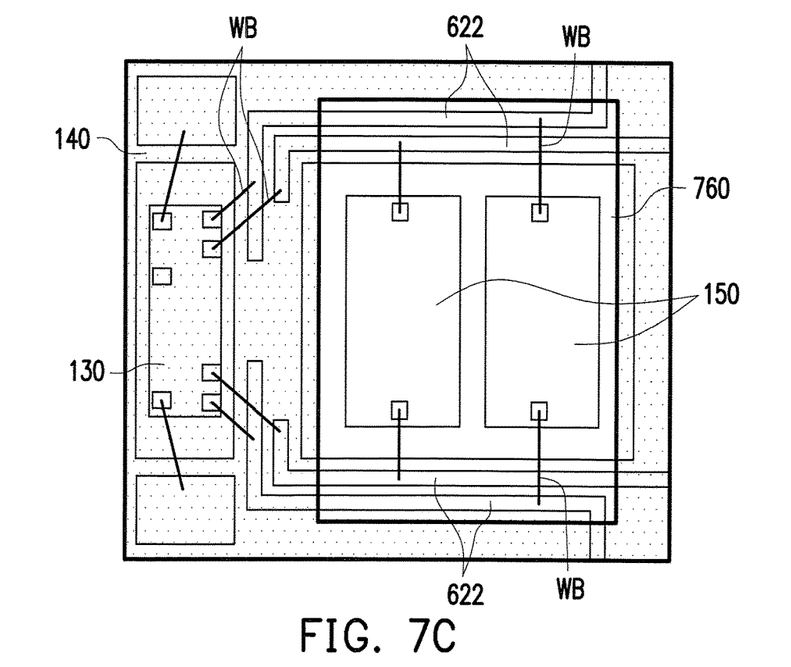
Figure 7D:
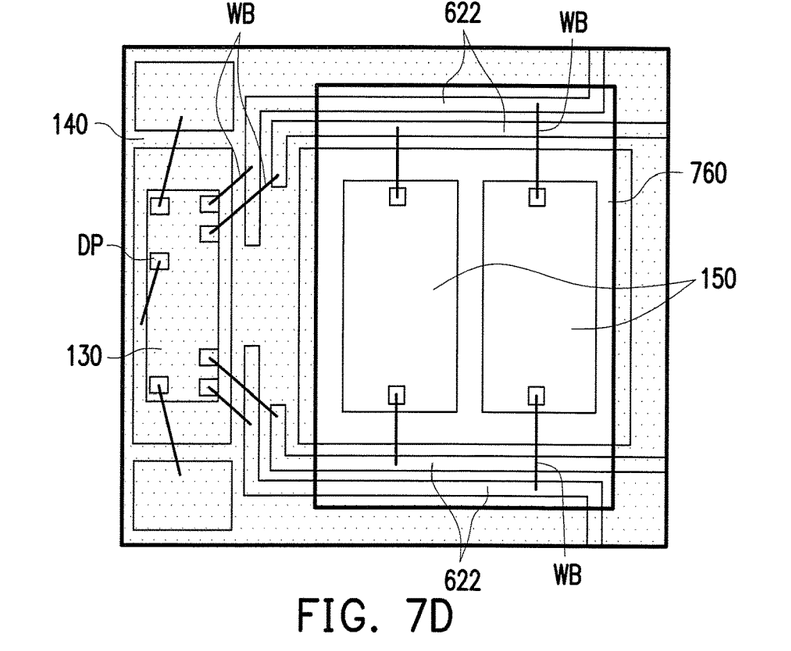

Besides, in the embodiments shown in FIGS. 7A and 7B, the number of the chip 150 on each of the lead frame units 620 is described as one, for example. However, the invention is not limited thereto. As shown in FIGS. 7C and 7D, the number of the chip 150 on each of the lead frame units 620 is plural, and the number of the controller 130 is also plural (illustrated as two in FIGS. 7C and 7D as an example). In addition, the controllers 130 may be electrically connected with the second pins 622 through the bonding wires WB, and the chips 150 are electrically connected with the second pins 622 through the bonding wires WB. For example, in the embodiments shown in FIGS. 7C and 7D, the controller 130 is suitable to be applied with an AC voltage, and a voltage that the controller 130 is capable of carrying is about 40 volts. Alternatively, a controller capable of carrying a wider range of the voltage may also be chosen and used as the controller 130. For example, a maximum voltage that the controller 130 is capable of carrying is in a range from 12 volts to 72 volts. It should be noted that the numerical value recited herein merely serves as an exemplary purpose and shall not be construed as a limitation of the invention.

Also, in the embodiments of FIGS. 7A and 7C, the controller 130 may output a constant current when being applied with a constant voltage. As for the embodiments in FIGS. 7B and 7D, a suitable voltage and/or current may be applied to the controller 130 to adjust an intensity of an output current by using a pad DP connected with an external resistance.

Referring to FIG. 4 again, in this embodiment, the second electrical testing may also be performed to each of the lead frame units 620 carrying the controllers 130 and the chips 150 (i.e., carrying out Step S180) in the embodiments shown in FIGS. 7A to 7D. Accordingly, the electrical property of each of the lead frame units 620 carrying the controllers 130 and the chips 150 may be properly evaluated and selected, so as to be properly used based on practical requirements.

Besides, in the embodiment shown in FIGS. 7A to 7D, each of the lead frame units 120 further includes a heat sink 760. In addition, the first package 140 encapsulates the heat sink 760, and the heat sink 760 is exposed by the opening OP of the first package 140, and the chip 150 is disposed on the heat sink 760. Accordingly, heat generated when the chip 150 is being operated is dissipated in a higher efficiency, so as to suppress rising of a temperature of the chip 150.

In view of the foregoing, the testing method according to the embodiments of the invention may perform electrical testing to each of the lead frame units carrying the controllers. Also, based on the results of the electrical testing, the lead frame units carrying the controllers are graded. Thus, the electrical property of each of the lead frame units carrying the controllers in the lead frame may be properly evaluated and selected, so that the lead frame units may be used with the suitable chips based on practical needs to thereby improve the yield rate of the subsequent processes.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A testing method, comprising:
   providing a lead frame, wherein the lead frame comprises a frame body and a plurality of lead frame units connected with each other through the frame body and arranged in an array, each of the lead frame units comprises at least one first pin connected with the frame body and a plurality of second pins connected with each other;
   bonding a plurality of controllers to the lead frame units, and electrically connecting each of the controllers with one of the lead frame units correspondingly;
   forming a plurality of first packages corresponding to the lead frame units on the lead frame, wherein the first packages encapsulate the controllers and the lead frame units, and each of the first packages has a peripheral portion covering the lead frame and an opening encircled by the peripheral portion to exposes a portion region of the corresponding lead frame unit;
   electrically isolating the frame body and the second pins; and
   performing a first electrical testing to the lead frame units carrying the controllers.

2. The testing method as claimed in claim 1, further comprising:
   grading the lead frame units carrying the controllers based on results of the first electrical testing.

3. The testing method as claimed in claim 1, wherein the step of electrically isolating the frame body and the second pins comprises:
   cutting the second pins of the respective lead frame units, such that the second pins connected with each other are isolated.

4. The testing method as claimed in claim 1, further comprising:
   bonding the chips to the lead frame units exposed by the openings;
   electrically connecting each of the chips with one of the lead frame units correspondingly; and
   performing a second electrical testing to the lead frame units carrying the controllers and the chips.

5. The testing method as claimed in claim 4, further comprising:
   grading each of the lead frame units carrying the controllers and the chips based on results of the second electrical testing.

6. The testing method as claimed in claim 1, further comprising:
   bonding the chips to the lead frame units exposed by the openings;
   electrically connecting each of the chips with one of the lead frame units correspondingly;
   forming a second package in each of the openings to encapsulate one of the chips correspondingly; and
   performing a second electrical testing to the lead frame units carrying the controllers and the chips.

7. The testing method as claimed in claim 6, further comprising:
   grading each of the lead frame units carrying the controllers and the chips based on results of the second electrical testing.

* * * * *